United States Patent [19]

Suzuki et al.

[11] 4,259,686

[45] Mar. 31, 1981

[54] CIRCUIT FOR PRODUCING A POLARITY-REVERSED VOLTAGE WITH OPPOSITE POLARITY TO THAT OF A POWER SUPPLY VOLTAGE

[75] Inventors: Yasoji Suzuki, Ayase; Tetsuya Iida, Yokohama, both of Japan

[73] Assignee: Tokyo Shibaura Denki Kabushiki Kaisha, Japan

[21] Appl. No.: 947,432

[22] Filed: Oct. 2, 1978

[30] Foreign Application Priority Data

Oct. 3, 1977 [JP] Japan .................................. 52-118784

[51] Int. Cl.³ .......................................... H03K 5/00
[52] U.S. Cl. ................................... 307/262; 307/255; 307/304; 307/583
[58] Field of Search ............... 307/255, 251, 262, 304

[56] References Cited

U.S. PATENT DOCUMENTS

| | | | |
|---|---|---|---|
| 3,651,342 | 3/1972 | Dingwall | 307/251 |
| 4,142,114 | 2/1979 | Green | 307/304 |

OTHER PUBLICATIONS

Pashley et al., 1976, IEEE *Int. Solid State Circuits Conf.* pp. 138–139.
*Electronics Review*, Sep. 16, 1976, pp. 42–43.

Frantz et al., *I.B.M. Tech. Discl. Bull.*, vol. 11, No. 10, Mar. 1969.

*Primary Examiner*—Martin H. Edlow
*Attorney, Agent, or Firm*—Finnegan, Henderson, Farabow, Garrett & Dunner

[57] ABSTRACT

An inverter is controlled by first clock pulses for converting a positive power supply into second clock pulses having a first voltage level of the power supply and a second voltage level of a reference voltage. The second clock pulses are supplied to a capacitor. The source-drain path of a first impedance varying P-FET is connected between the output terminal of the capacitor and the reference voltage and is controlled so as to take a low impedance when the second clock pulses are at the first voltage level while a high impedance when the second clock pulses are at the second voltage level. The source-drain path of a second impedance varying P-FET is connected between the output terminal and a terminal for taking out a polarity-reversed voltage. The second impedance varying P-FET is supplied at the gate with the first clock pulses so as to be controlled to take a high impendance when the second clock pulses are at the first voltage level and a low impedance when the second clock pulses are at the second level.

9 Claims, 16 Drawing Figures

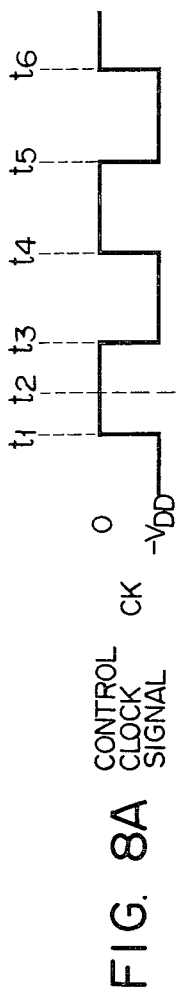
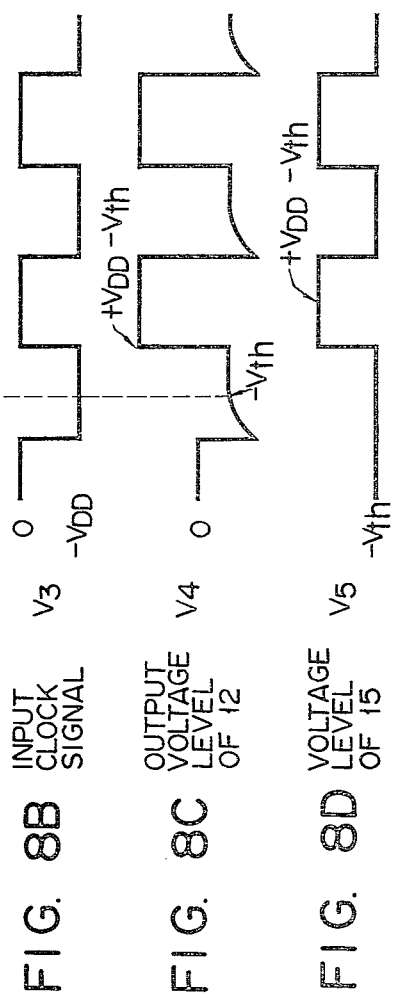
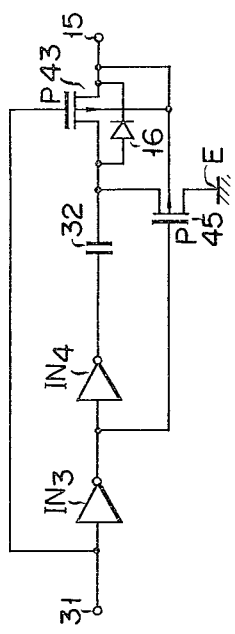
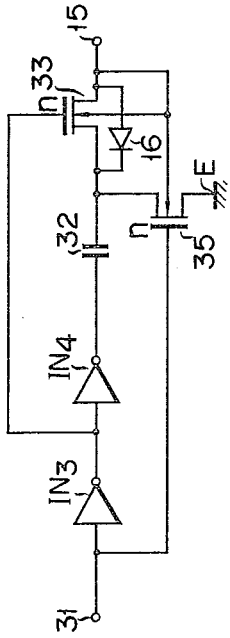
FIG. 8A CONTROL CLOCK SIGNAL CK
FIG. 8B INPUT CLOCK SIGNAL V3
FIG. 8C OUTPUT VOLTAGE LEVEL OF 12 V4
FIG. 8D VOLTAGE LEVEL OF 15 V5
FIG. 9
FIG. 10

CIRCUIT FOR PRODUCING A POLARITY-REVERSED VOLTAGE WITH OPPOSITE POLARITY TO THAT OF A POWER SUPPLY VOLTAGE

BACKGROUND OF THE INVENTION

The invention relates to a circuit for producing a polarity-reversed voltage with opposite polarity to a power supply voltage.

Generally, when the withstand voltage of a transistor is raised, the impurity concentration of its semiconductor substrate is set up to be lower. If the concentration is so set up, however, the threshold voltage $V_{th}$ of the transistor, for example, a MOS-FET (metal oxide semiconductor field effect transistor) inevitably becomes lower. For this reason, a back-gate bias must be applied to the substrate in order to obtain an MOS-FET with high withstand voltage and high threshold voltage $V_{th}$. It has been known that, when a back gate voltage is applied between the source of the MOS-FET and the substrate, the back-gate bias effect raises the threshold voltage $V_{th}$ of the MOS-FET corresponding to the voltage value applied. In this case, the polarity of the back-gate bias to be applied to the substrate electrode must be opposite to that of the power supply voltage for the MOS-FET. In other words, a polarity-reversed voltage with opposite polarity to the power supply voltage must be produced for the back-gate biasing. Further, it is desirable that the polarity-reversed voltage is effectively produced and its value is always constant.

One form of the conventional circuit for producing a polarity-reversed voltage with opposite polarity to the power source voltage (hereinafter referred to a polarity-reversed voltage) is illustrated in FIG. 1. In the figure, a couple of n-channel MOS-FETs connected in series are connected between a power supply voltage $+V_{DD}$ and a ground potential point E. A clock signal $\phi$ is applied to the gate of the transistor 1 and a clock signal $\overline{\phi}$ is applied to the gate of the transistor 2. The clock signal $\overline{\phi}$ is an antiphase signal of the clock signal $\phi$, as a matter of course. Assume that a first level of each clock pulse $\phi$ and $\overline{\phi}$ are $+V_{DD}$ and $-V_{DD}$ (H level) and a second level thereof is 0 level (L level). The connection point of the first and second transistors is coupled with the input terminal of a capacitor 3. Between the output terminal of the capacitor 3 and the ground potential point E is connected an n-MOS FET 4 of which the gate is connected to the output terminal of the capacitor 3. A diode 6 is inevitably formed between the source or drain of a transistor 4 and the substrate when the polarity-reversed voltage producing circuit shown in FIG. 1 is integrated. The output terminal 5 of the polarity-reversed voltage, i.e. the voltage with opposite polarity to that of the $+V_{DD}$, is coupled with the output terminal of the capacitor 3, through the diode 6 connected with the polarity as shown. The substrate electrodes of transistors 1, 2 and 4 are connected to the polarity-reversed voltage output terminal 5. If necessary, a second capacitor 7 is connected between the terminal 5 and the ground potential point E.

In the circuit in FIG. 1, when the clock signal $\phi$ is at H level ($+V_{DD}$ or active level), the clock signal $\overline{\phi}$ is at L level (ground level or non-active level) so that the transistor 1 is rendered conductive and the transistor 2 is rendered nonconductive. Accordingly, the voltage level $V_1$ at the input terminal of the capacitor 3 becomes H level, i.e. $+V_{DD}$ level. When the level at the input terminal of the capacitor 3 becomes $+V_{DD}$ level the voltage level $V_2$ at the output terminal of the capacitor 3 also goes positive as the voltage level $V_1$ at the input terminal of the capacitor 3 goes positive. Here, the threshold voltage of the n-channel transistor 4 is expressed by $V_{th}$. When the voltage level at the output terminal of the capacitor 3 exceeds the threshold voltage $V_{th}$, the transistor 4 is rendered conductive and the voltage level $V_2$ at the output terminal of the capacitor 3 is kept at the ground potential so that the potential difference across the capacitor 3 is kept at approximately $+V_{DD}$.

At this time, the clock signal $\phi$ becomes L level and the clock signal $\overline{\phi}$ becomes H level with the result that the transistor 1 is rendered nonconductive while the transistor 2 is rendered conductive. Accordingly, the voltage level $V_1$ at the input terminal of the capacitor 3 approaches from $+V_{DD}$ level to the ground level. As described above, the voltage level $V_2$ at the output terminal of the capacitor 3 is sustained at approximately ground level, and therefore the voltage level $V_2$ at the output terminal of the capcitor 3 becomes lower than the ground level, that is to say, it becomes negative voltage level. Since the negative voltage or potential is applied to the gate of the transistor 4, the transistor 4 is rendered nonconductive. The negative voltage appearing at the output terminal of the capacitor 3 is taken out from the terminal 5 through the diode 6. The second capacitor 7 is used to keep the output voltage at the terminal 5 constant value. As described above, the circuit shown in FIG. 1 enables a voltage with opposite polarity to the $+V_{DD}$ to be derived from the output terminal 5.

The convention circuit shown in FIG. 1, however, has the following disadvantages. Since the desired polarity-reversed voltage is taken out from the terminal 5 through the diode 6, the polarity-reversed voltage value is reduced by an amount of the forward voltage drop of the diode 6. Another disadvantage is that, since the back-gate bias is applied to a number of FETs (not limited to the one shown) through the terminal 5, the back-gate bias current also flows through the diode 6. Accordingly, when the back-gate bias current changes, the forward voltage drop of the diode 6 also changes and therefore the value of the polarity-reversed voltage is not constant.

Accordingly, an object of the invention is to provide a circuit for producing a polarity-reversed voltage with opposite polarity to a power supply voltage in which the loss of the polarity-reversed voltage is minimum and the voltage level thereof is invariable.

SUMMARY OF THE INVENTION

According to the invention, there is provided a circuit for producing a polarity-reversed voltage with opposite polarity to that of a power supply voltage comprising: an input clock signal source for producing an input clock signal in which a first voltage level with the same polarity as the power supply voltage and second voltage level of which the magnitude is lower in absolute value than the absolute value of the first voltage level; a capacitor for coupling in receiving relation with the input clock signal; first impedance changing means connected between the output terminal of the capacitor and a reference potential point with a reference voltage level, the first impedance changing means being so controlled as to take a low impedance state when the input clock signal is at the first voltage level and a high impedance state when the input clock signal is at the second voltage level; second impedance changing means connected at one end to the output terminal of the capacitor, the second impedance changing means being so controlled as to take a high impedance state when the input clock signal is at the first voltage level and a low impedance state when the input clock signal is at the second voltage level; and an output terminal connected to the other terminal of the second impedance changing means and through which a polarity-reversed voltage with opposite polarity to that of the power supply voltage is withdrawn.

Other objects and features of the invention will be apparent from the following description taken in connection with the accompanying drawings, in which:

BRIEF DESCRIPTION OF THE DRAWINGS

FIGS. 8A to D show a set of wave forms for illustrating the operation of the circuit shown in FIG. 7;

FIG. 9 shows a block diagram of a third embodiment of the circuit according to the invention;

FIG. 10 shows a block diagram of a fourth embodiment of the circuit according to the invention.

DETAILED DESCRIPTION OF THE PREFERRED EMBODIMENTS

Figure 1:
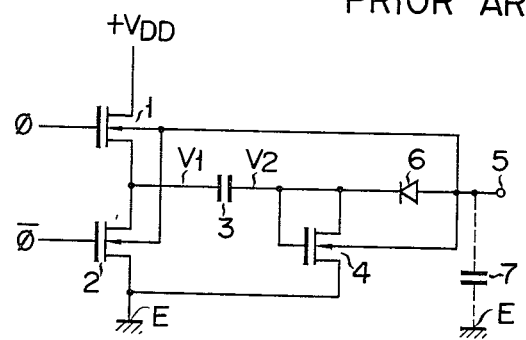
FIG. 1 shows a circuit diagram of a conventional circuit for producing a polarity-reversed voltage with opposite polarity to a power supply voltage.
Figure 2:
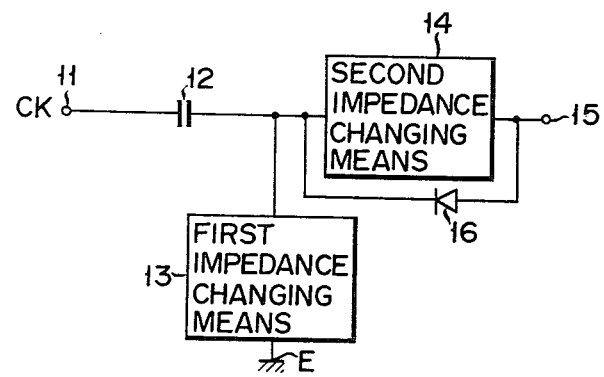
FIG. 2 shows a block diagram of a first embodiment of the circuit according to the invention.

Reference is made to FIG. 2 illustrating a first embodiment of the invention for converting a positive power supply voltage $+V_{DD}$ into a polarity-reversed voltage having a negative polarity. In the figure, CK designates an input clock signal which is derived from a positive power supply and periodically repeats a positive first voltage level (H level or active level) and a second voltage level (L level or non-active level) of which the absolute value is smaller than the first voltage level. The input clock signal is applied to the input of a capacitor 12 through an input terminal 11. A first impedance changing means 13 comprised of an n-channel MOS-FET (abbreviated as an N transistor) is connected between the output of the capacitor 12 and ground point E. When the input clock signal CK is at the first voltage level or H level, the N transistor is rendered conductive to exhibit a low impedance state, while when it is at the second voltage level or L level, the N transistor is rendered nonconductive to exhibit a high impedance state. The capacitor is connected at the output end to an input terminal of a second impedance changing means 14 which is comprised of another n-channel MOS-FET. The N transistor of the second impedance changing means is rendered nonconductive to exhibit a high impedance state when the input clock signal CK is at the first voltage level while it is rendered conductive to exhibit a low impedance state when the input clock signal CK is at the second level. The output of the second impedance changing means is coupled to an output terminal 15 through which a polarity-reversed voltage with opposite polarity to a positive power supply voltage $+V_{DD}$ is introduced to exterior. A diode 16 is connected across the second impedance changing means, with the polarity as shown. As mentioned referring to FIG. 1, the diode 16 is inevitably formed between the drain or the source of the N transistor in the first impedance changing means and the substrate when the polarity-reversed voltage producing circuit is fabricated into an integrated circuit.

Figure 3:
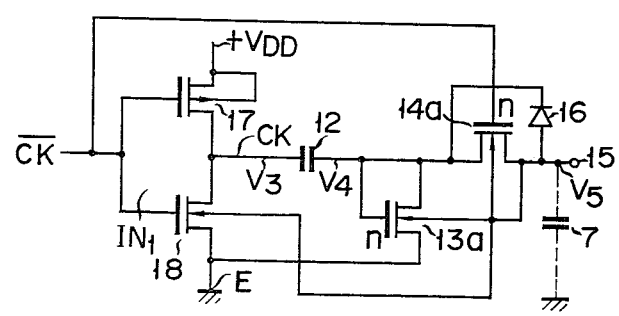
FIG. 3 shows a detailed circuit diagram of the circuit shown in FIG. 2.

The details of the circuit shown in FIG. 2 is illustrated in FIG. 3. As shown, a circuit $IN_1$ for generating the input clock signal CK is an inverter comprised of a p-channel MOS-FET 17 and an n-channel MOS-FET 18 both being connected in series between $+V_{DD}$ and ground E. A control clock signal $\overline{CK}$ is applied to the gates of the transistors 17 and 18. An input clock signal CK from the inverter $IN_1$ is coupled with the input terminal of the capacitor 12. Between the output terminal of the capacitor 12 and ground E is connected an n-channel MOS-FET 13a representing the first impedance changing means 13. The gate of the MOS-FET 13a is connected to the output terminal of the capacitor 12. Between the output of the capacitor 12 and the polarity-reversed voltage output terminal 15 is connected another n-channel MOS-FET 14a constituting the second impedance changing means 14. Applied to the gate of the N transistor 14a is the control clock signal $\overline{CK}$. The diode 16 is connected between both ends of the N transistor 14a. The polarity-reversed voltage output terminal 15 is connected to the substrate electrodes of the transistors 18, 13a and 14a. The substrate electrode of the P transistor 17 is connected to $+V_{DD}$. In the figure, the voltage level at the input terminal of the capacitor 12 is designated by $V_3$; the voltage level of the output terminal of the same by $V_4$; the voltage level at the polarity-reversed voltage output terminal 15 by $V_5$. A second capacitor 7 for smoothing the polarity-reversed output voltage is used if necessary.

Figure 4:
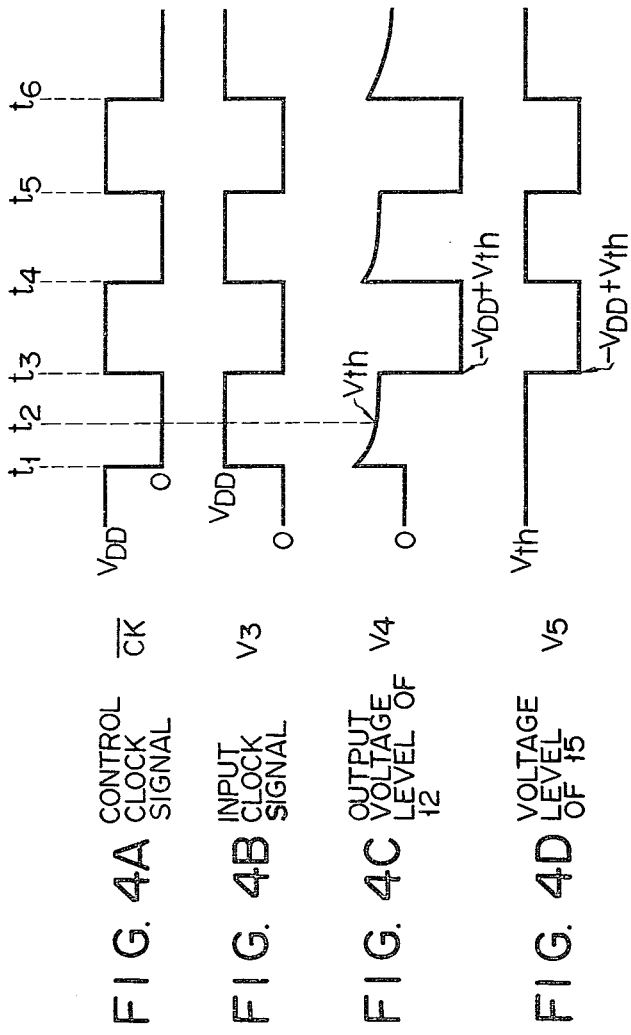
FIGS. 4A to D show a set of waveforms for illustrating the operation of the circuit shown in FIG. 3.

The operation of the circuit in FIG. 3 will be described with reference to time charts shown in FIGS. 4A to 4D. In the explanation to follow, the capacitor 7 is not used. When the control clock signal $\overline{CK}$ falls from H level $(+V_{DD})$ to L level (ground level) at time $t_1$, the P transistor 17 is rendered conductive and the N transistor 18 is rendered nonconductive. Accordingly, the voltage level at the input terminal of the capacitor 12 rises from ground level to $V_{DD}$ level (FIG. 4B). The voltage level $V_4$ at the output of the capacitor 12 also rises from ground level to $V_{DD}$ level (FIG. 4C). At this time, applied to the gate of the N transistor 13a is a voltage exceeding $V_{th}$ (threshold voltage) of the transistor 13a. As a result, the transistor 13a is rendered conductive. Upon the conduction of the transistor 13a, the voltage level $V_4$ at the output terminal of the capacitor 12 gradually drops and passes time $t_2$ and at this time substantially equal to the threshold level $V_{th}$, with the result that the N transistor 13a is rendered nonconductive and the voltage level $V_4$ is sustained at the threshold level $V_{th}$ (see time $t_2$ to $t_3$ in FIG. 4C). At time $t_3$, the control clock signal $\overline{CK}$ rises from ground level to $V_{DD}$ level (FIG. 4A), the P transistor 17 is rendered nonconductive and the N transistor 18 is rendered conductive.

Accordingly, the voltage level $V_3$ at the input terminal of the capacitor 12 falls from $V_{DD}$ level to ground level (FIG. 4B). Since the potential difference between terminals of the capacitor 12 is substantially $V_{DD}$, the voltage level $V_4$ at the output of the capacitor 12 goes negative by the level of about $V_{DD}$. Therefore, the voltage level $V_4$ at time $t_3$ is approximately $-V_{DD}+V_{th}$. On the other hand, at time $t_3$ a signal of $V_{DD}$ is applied to the gate of the N transistor 14a so that the transistor 14a conducts at time $t_3$. With sufficiently large mutual conductance $g_m$ of the N transistor 14a, a negative voltage $(-V_{DD}+V_{th})$ appearing at the output terminal of the capacitor 12 may be delivered to the polarity-reversed voltage output terminal 15 through the N transistor 14a, not through the diode 16. See FIG. 4D. The withdrawal of the polarity-reversed voltage through the N transistor 14a means that the polarity-reversed voltage may be withdrawn with little damping. If the mutual conductance $g_m$ of the transistor 14a is sufficiently large, a voltage drop variation due to the variation of the current flowing through the transistor 14a is negligible so that the polarity-reversed voltage at the terminal 15 may always be kept constant irrespective of variation of the back gate bias current. If the capacitor 7 is inserted between the terminal 15 and the ground E, the N transistor 14a is rendered nonconductive during the time interval extending from time $t_4$ to time $t_5$. For this, the polarity-reversed voltage for a time interval from $t_3$ to $t_4$ is sustained as it is during the subsequent time interval $t_4$ to $t_5$. Therefore, the value of the polarity-reversed voltage appearing at the output terminal 15 is also maintained at constant.

Figure 5:
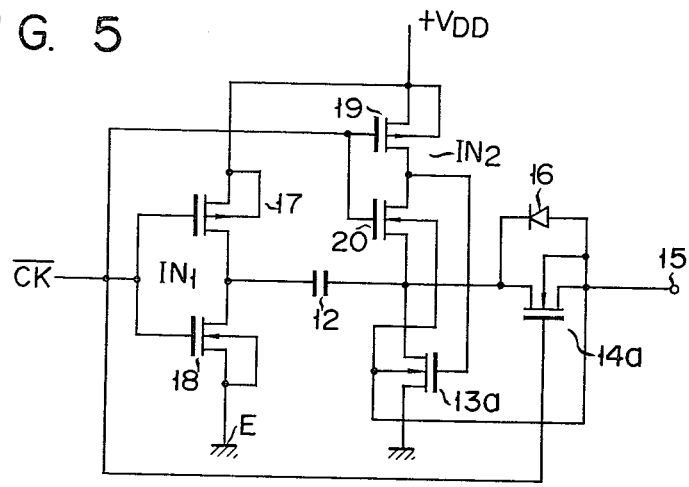
FIG. 5 shows another detailed modification of the circuit shown in FIG. 2.

Referring now to FIG. 5, there is shown another embodiment of the polarity-reversed voltage producing circuit of FIG. 2 according to the invention. Unlike the first impedance changing means shown in FIG. 3 comprising the N transistor 13a, the first impedance changing means in FIG. 5 is comprised of an N transistor 13a and a second inverter $IN_2$. As shown, a p-channel MOS-FET 19 and an n-channel MOS-FET 20 are connected in series between the power source $+V_{DD}$ and the output terminal of the capacitor 12. The control clock signal $\overline{CK}$ is supplied to the gates of the transistors 19 and 20 and the output of the second inverter $IN_2$ is coupled in supplying relation with the gate of the N transistor 13a. The substrate electrode of the P transistor 19 is connected to the $+V_{DD}$ and the substrate electrode of the N transistor 20 to the polarity-reversed voltage output terminal 15.

In the example in FIG. 5, the second inverter $IN_2$ inverts the control clock signal $\overline{CK}$ in polarity and the inverted clock signal of $\overline{CK}$ is used to drive the N transistor 13a. With such a circuit connection, the switching time of the N transistor 13a may be speeded up and hence the polarity-reversed voltage may effectively be taken out.

Figure 6:
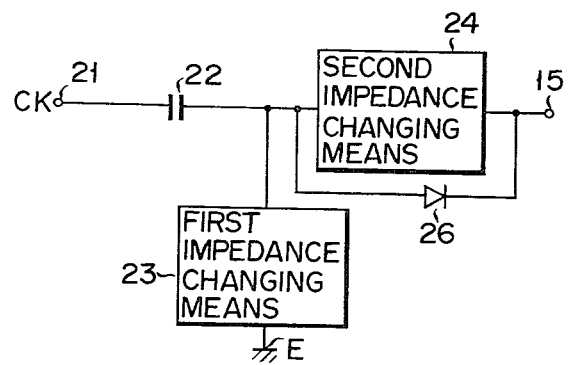
FIG. 6 shows a block diagram of a second embodiment of the circuit according to the invention.

In a second embodiment shown in FIG. 6, a polarity-reversed voltage with positive polarity is produced from a negative power supply voltage $-V_{DD}$ (not shown). Also in FIG. 6, a first voltage level (H level or $-V_{DD}$ level) and a second level (L level or ground level) are alternatively and periodically applied in the form of an input clock signal CK to the input terminal of a capacitor 22 through an input terminal 21. Between the output terminal of a capacitor 22 and ground E is inserted a first impedance changing means 23 comprising a p-channel MOS-FET. The first impedance changing means 23 is rendered conductive to be a low impedance state when the input clock signal CK is at the first level. On the other hand, it is rendered nonconductive to be a high impedance state when the input clock signal CK is at the second level. The output terminal of the capacitor 12 is coupled in applying relation with the input of a second impedance changing means 24 comprising a p-channel MOS-FET. When the input clock signal CK is at the first level (H level), the second impedance changing means is rendered nonconductive to be a high impedance state. When the input clock signal CK is at the second level (L level), it is rendered conductive to be a low impedance state. The second impedance changing means is connected at the output to a polarity-reversed voltage output terminal 15 through which a polarity-reversed voltage with oppositive polarity to the power supply voltage $-V_{DD}$ is delivered to exterior. A diode 16 is connected between the input and output terminals of the second impedance changing means 24, with the polarity as shown. The diode 16 is enevitably formed between the source or drain and the substrate of the P transistor when the polarity-reversed voltage producing circuit is assembled into an integrated circuit.

Figure 7:
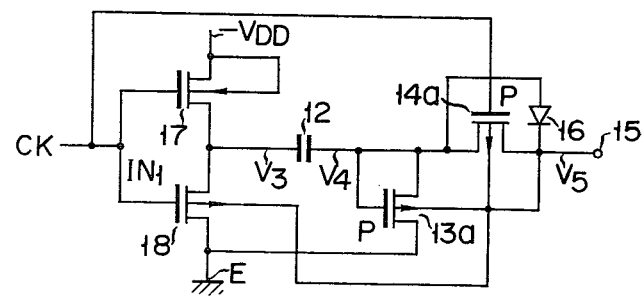
FIG. 7 shows a detailed circuit diagram of the circuit shown in FIG. 6.

A detailed circuit diagram for the second embodiment illustrated in FIG. 6 is shown in FIG. 7. The difference of it from the FIG. 3 circuit is: the power supply voltage is $-V_{DD}$, the transistor 17 an n-channel MOS-FET, the transistor 18 a p-channel MOS-FET, the transistors 13a and 14a are of p-channel type, the diode 16 is connected at the cathode to the terminal 15. The operation of the circuit will be readily understood by the skilled persons in the field. Therefore, no elaboration of the circuit will be given structurally and operationally, although the time charts useful in explaining the operation is depicted in FIGS. 8A to 8D.

A third embodiment of the invention, which is schematically shown in FIG. 9, produces a polarity-reversed voltage with negative polarity on the basis of a positive power supply voltage $+V_{DD}$. To a terminal 31 is applied a control clock signal with active level (first level) of $+V_{DD}$. The control clock signal is inverted by an inverter $IN_3$ into a control clock signal with active level (first level) of $-V_{DD}$. The inverted control clock signal is further inverted by an inverter $IN_4$ into a clock signal with active level of $+V_{DD}$. The output of the inverter $IN_4$ is applied as an input clock signal to the capacitor 32. Between the output terminal of the capacitor 32 and ground E connected an n-channel MOS-FET 35 of which the gate is connected to the terminal 31. Between the output terminal of the capacitor 32 and the polarity-reversed voltage output terminal 15 is connected another n-channel MOS-FET of which the gate is coupled in receiving relation with the output of the inverter $IN_3$. Between the source and drain of the N transistor 33 is connected a diode 16 as mentioned in FIG. 3, with the polarity as shown. That a voltage with opposite polarity to the $+V_{DD}$ from the terminal 15 is applied to the substrate electrodes of the N transistors 33 and 35 is as the example in FIG. 3. While the N transistor 13a is under control of the potential at the output terminal of the capacitor 12 in FIG. 3 example, the FIG. 9 example is such that the transistor 35 is directly controlled by the control clock pulse from the terminal 31. The result is an improvement of the production efficiency of the polarity-reversed voltage.

A fourth embodiment is illustrated in FIG. 10, in which a polarity-reversed voltage with positive polarity is produced from a negative power supply voltage. In FIG. 10, to the terminal 31 is applied a control clock signal with active level (first voltage level) of $-V_{DD}$. The control clock signal is converted into a control clock signal with active level (first voltage level) of $+V_{DD}$, by the inverter IN$_3$. The output of the inverter IN$_3$ is inverted again by the inverter IN$_4$ into a clock signal with active level (first voltage level) of $-V_{DD}$. The output of the inverter IN$_4$ is supplied as an input clock signal to the capacitor 32. Between the output terminal of the capacitor 32 and the ground potential point E is connected a p-channel MOS-FET 45. To the gate of the P transistor 45 is applied the output of the inverter IN$_3$. Between the output terminal of the capacitor 32 and the polarity-reversed output voltage terminal 15 is connected another p-channel MOS-FET 43 of which the gate is coupled with the terminal 31. The operation of this instance is almost similar to that of the example in FIG. 7 and FIGS. 8A to D, and hence its elaboration will be omitted here. Since the output of the inverter IN$_3$ is directly coupled with the gate of the P transistor 45, the producing effifiency of the polarity-reversed voltage is improved as in the FIG. 9 example.

What we claim is:

1. A circuit for producing a polarity-reversed voltage with opposite polarity to that of a power supply voltage comprising:

an inverter supplied with said power supply voltage and controlled by first clock pulses, said inverter inverting said power supply voltage in response to said first clock pulses for producing second clock pulses having a first voltage level with the same polarity as said power supply voltage and a second voltage level of which the magnitude is lower in absolute value than the absolute value of said first voltage level;

a capacitor coupled to receive said second clock pulses;

a first impedance varying FET of which the source-drain path is connected between the output terminal of said capacitor and a reference potential point with a reference voltage level, said first impedance varying FET being so controlled as to take a low impedance state when said second clock pulses are at said first voltage level and a high impedance state when said second clock pulse is at said second voltage level;

a second impedance varying FET having a channel with the same conductivity type as said first impedance varying FET, connected at the source to the output terminal of said capacitor and being supplied at the gate with clock pulses having the same polarity as said first clock pulses and synchronized with said first clock pulses, said second impedance varying FET being so controlled as to take a high impedance state when said second clock pulses are at said first voltage level and a low impedance state when said second clock pulses are at said second voltage level; and a polarity-reversed voltage output terminal connected to the drain of said second impedance varying FET and through which a polarity-reversed voltage with opposite polarity to that of said power supply voltage is withdrawn.

2. A circuit for producing a polarity-reversed voltage according to claim 1, further comprising a second capacitor for smoothing said polarity-reversed voltage, which is connected between said polarity-reversed voltage output terminal and said reference potential point.

3. A circuit for producing a polarity-reversed voltage according to claim 1, in which the first voltage level of said second clock pulses is a positive level and said second voltage level is a ground level; said first impedance varying FET includes an n-channel, and said second impedance varying FET includes an n-channel.

4. A circuit for producing a polarity-reversed voltage according to claim 1, in which said first voltage level of said second clock pulses is a negative level and said second voltage level is a ground level; said first impedance varying FET includes a p-channel.

5. A circuit for producing a polarity-reversed voltage according to claim 3, in which said inverter includes a p-channel FET and an n-channel FET which are connected in series at the source-drain paths between a positive power supply and a reference potential point, and of which the gates are supplied with said first clock pulses, the substrate electrode of said p-channel FET being connected to said power supply while the substrate electrode of said n-channel being connected to said polarity-reversed voltage output terminal, the output terminal of said inverter being coupled with the input terminal of said capacitor; said first impedance varying FET is coupled at the gate with the output terminal of said capacitor and at the substrate electrode with said polarity-reversed voltage output terminal; said second impedance varying FET is supplied at the gate with said first clock pulses and at the substrate with said polarity-reversed voltage output terminal.

6. A circuit for producing a polarity-reversed voltage according to claim 4, in which said inverter includes an n-channel FET and a p-channel FET which are connected in series at the source-drain paths between a negative power supply and a reference potential point, and of which the gates are supplied with said first clock pulses, the substrate electrode of said n-channel FET being connected to said power supply while the substrate electrode of said p-channel FET being connected to said polarity-reversed voltage output terminal, the output terminal of said inverter being coupled with the input terminal of said capacitor; said first impedance varying FET is coupled at the gate with the output terminal of said capacitor and at the substrate electrode with the polarity-reversed voltage output terminal; and said second impedance varying FET is supplied at the gate with said first clock pulses and at the substrate with said polarity-reversed voltage output terminal.

7. A circuit for producing a polarity-reversed voltage according to claim 3, in which said second clock pulses are produced from a first inverter including a first p-channel FET and a first n-channel FET which are connected in series at the source-drain paths between a positive power supply and a reference potential point, and of which the gates are supplied with said first clock pulses, the substrate electrode of said first p-channel FET being connected to said power supply while the substrate electrode of said first n-channel FET being connected to said reference potential point, the output of said first inverter being connected to the input of said capacitor; said first impedance varying FET is connected at the gate to the output of a second inverter including a second p-channel FET and a second n-channel FET which are connected in series at the source-drain paths between said positive power supply and the output terminal of said capacitor, and of which the gates are supplied with said first clock pulses, the substrate electrode of said second p-channel FET being connected to said positive power source while the substrate electrode of said second n-channel FET being connected to said polarity-reversed voltage output terminal; and said second impedance varying FET is supplied at the gate with said first clock pulse and at the substrate electrode to said polarity-reversed voltage output terminal.

8. A circuit for producing a polarity-reversed voltage according to claim 3, which further comprises a second inverter having an input for receiving third clock pulses and an output which supplies said first clock pulses to said inverter controlled by said first clock pulses, said first impedance varying FET being controlled at the gate by said third clock pulses and FET being controlled at the gate by said third clock pulses and said second impedance varying FET being controlled at the gate by said first clock pulses.

9. A circuit for producing a polarity-reversed voltage with opposite polarity to that of a power supply voltage comprising:
- a first inverter controlled by first clock pulses to produce second clock pulses;
- a second inverter supplied with said power supply controlled by said second clock pulses, said inverter inverting said power supply in response to said second clock pulses for producing third clock pulses having a first negative level which is the same magnitude as said power supply voltage and a second ground voltage level;
- a capacitor coupled to receive said third clock pulses;
- a first impedance varying FET including a p-channel of which the source-drain path is connected between the output terminal of said capacitor and a reference potential point with a reference voltage level, said first impedance varying FET being controlled at the gate by said second clock pulses;
- a second impedance varying FET having a p-channel and connected at the source to the output terminal of said capacitor and being supplied at the gate with said first clock pulses; and
- a polarity-reversed voltage output terminal connected to the drain of said second impedance varying FET and through which a polarity-reversed voltage with opposite polarity to that of said power supply voltage is withdrawn.

* * * * *